United States Patent
Shigeta et al.

(10) Patent No.: US 10,564,187 B2
(45) Date of Patent: Feb. 18, 2020

(54) CURRENT DETECTION DEVICE INCLUDING A CURRENT SENSOR TO DETECT MAGNETIC FIELD VECTORS

(71) Applicant: HITACHI AUTOMOTIVE SYSTEMS, LTD., Hitachinaka-shi, Ibaraki (JP)

(72) Inventors: Satoru Shigeta, Hitachinaka (JP); Atsushi Okabe, Hitachinaka (JP); Yuji Sobu, Hitachinaka (JP)

(73) Assignee: HITACHI AUTOMOTIVE SYSTEMS, LTD., Hitachinaka-Shi (JP)

( * ) Notice: Subject to any disclaimer, the term of this patent is extended or adjusted under 35 U.S.C. 154(b) by 0 days.

(21) Appl. No.: 16/302,035

(22) PCT Filed: Apr. 7, 2017

(86) PCT No.: PCT/JP2017/014463
§ 371 (c)(1),
(2) Date: Nov. 15, 2018

(87) PCT Pub. No.: WO2017/199626
PCT Pub. Date: Nov. 23, 2017

(65) Prior Publication Data
US 2019/0154736 A1 May 23, 2019

(30) Foreign Application Priority Data
May 16, 2016 (JP) .................................. 2016-097579

(51) Int. Cl.
*G01R 15/20* (2006.01)
*H02M 1/00* (2006.01)
(Continued)

(52) U.S. Cl.
CPC .............. *G01R 15/20* (2013.01); *G01R 33/02* (2013.01); *G01R 33/24* (2013.01); *H02M 1/00* (2013.01); *H02M 2001/0009* (2013.01)

(58) Field of Classification Search
CPC . H02M 2001/0009; G01R 1/18; G01R 15/20; G01R 29/08; G01R 31/001; G01R 33/0017; G01R 33/02; G01R 33/24
See application file for complete search history.

(56) References Cited

U.S. PATENT DOCUMENTS

| 6,605,936 B1* | 8/2003 | Tamai | G01R 15/202 324/117 R |
| 2011/0050222 A1* | 3/2011 | Ueno | G01R 15/207 324/253 |

(Continued)

FOREIGN PATENT DOCUMENTS

| JP | H08-152448 A | 6/1996 |
| JP | H09-084359 A | 3/1997 |

(Continued)

OTHER PUBLICATIONS

International Search Report with English translation issued in corresponding application No. PCT/JP2017/014463 dated Jul. 25, 2017.

*Primary Examiner* — Fred E Finch, III
*Assistant Examiner* — Rafael O. De León Domenech
(74) *Attorney, Agent, or Firm* — Foley & Lardner LLP

(57) ABSTRACT

To provide a further miniaturized and densified current detection device or a power conversion apparatus including the same.
A current detection device or a power conversion apparatus according to the present invention includes: a plurality of conductors corresponding to currents of a plurality of phases; and a current sensor. The plurality of conductors is formed so as to have a conductor portion in which the (Continued)

currents flowing in the plurality of conductors, respectively, are substantially parallel. In a cross section in a direction perpendicular to a flow direction of the current of the conductor portion, the current sensor is arranged in a region sandwiched between the plurality of conductor portions, and outputs information on a current flowing in the conductor based on a combination of magnetic field vectors generated by the plurality of currents.

7 Claims, 8 Drawing Sheets

(51) Int. Cl.
*G01R 33/02* (2006.01)
*G01R 33/24* (2006.01)

(56) References Cited

U.S. PATENT DOCUMENTS

| 2013/0162245 | A1* | 6/2013 | Tamura | G01R 33/07 324/225 |
| 2013/0265041 | A1* | 10/2013 | Friedrich | G01R 15/207 324/260 |
| 2014/0097826 | A1* | 4/2014 | Hebiguchi | G01R 15/207 324/117 R |
| 2016/0223594 | A1 | 8/2016 | Suzuki et al. | |

FOREIGN PATENT DOCUMENTS

| JP | 2008-203238 A | 9/2008 |
| JP | 2011-075536 A | 4/2011 |
| JP | 2013-057629 A | 3/2013 |
| JP | 2014-134458 A | 7/2014 |
| WO | WO-2015-033541 A1 | 3/2015 |

* cited by examiner

CURRENT DETECTION DEVICE INCLUDING A CURRENT SENSOR TO DETECT MAGNETIC FIELD VECTORS

CROSS-REFERENCE TO RELATED APPLICATIONS

This application is a National Phase of International Patent Application No. PCT/JP2017/014463, filed Apr. 7, 2017, which claims priority to Japanese Patent Application No. 2016-097579, filed May 16, 2016. The contents of these applications are herein incorporated by reference in their entirety.

TECHNICAL FIELD

The present invention relates to a current detection device and a power conversion apparatus including the same, and more particularly to a current detection device used for a hybrid vehicle, an electric vehicle, and the like and a power conversion apparatus including the same.

BACKGROUND ART

A current detection device and a power conversion apparatus including the current detection device are required to be improved in detection accuracy and to be used in an environment where an arrangement space is restricted. For example, a current detection device used for a hybrid vehicle, an electric vehicle, and the like, and a power conversion apparatus including the same are particularly required to have a small size, improved noise resistance and vibration resistance while maintaining detection accuracy in order for maintaining safety.

PTL 1 discloses a technique in which three conductors are arranged in parallel to each other and their axial lines are arranged in an equilateral triangle, a light sensor is provided at the center thereof, the light sensor measures a magnetic field, and a value of the magnetic field and a distance at the time of installation are calculated by a photoelectric conversion unit to obtain a current.

However, there is a demand for further miniaturization and high density in the current detection device and the power conversion apparatus including the same.

CITATION LIST

Patent Literature

PTL 1: JP 08-152448 A

SUMMARY OF INVENTION

Technical Problem

An object of the present invention is to provide a further miniaturized and densified current detection device or a power conversion apparatus including the same.

Solution to Problem

In order to solve the above-described problem, a current detection device according to the present invention includes: a plurality of conductors corresponding to currents of a plurality of phases; and a current sensor. The plurality of conductors is formed so as to have a conductor portion in which the currents flowing in the plurality of conductors, respectively, are substantially parallel. In a cross section in a direction perpendicular to a flow direction of the current of the conductor portion, the current sensor is arranged in a region sandwiched between the plurality of conductor portions, and outputs information on a current flowing in the conductor based on a resultant of magnetic field vectors generated by the plurality of currents.

Advantageous Effects of Invention

According to the present invention, it is possible to obtain the miniaturized and densified current detection device or the power conversion apparatus including the same.

DESCRIPTION OF EMBODIMENTS

The principle of the present invention will be described hereinafter.

A magnetic field vector generated by an infinite linear current has no component in the same direction as that of a current and has a two-dimensional vector component in a plane perpendicular to a direction of the current. In the present invention, to arrange a plurality of conductors substantially in parallel indicates to create a state where: (1) a certain amount of a linear part is included as an assumption of the infinite linear current; (2) a current direction is unique in the plurality of conductors; and (3) a plane perpendicular to the current direction is common among the plurality of conductors.

In the above-described manner, a resultant vector of magnetic fields generated by currents of a plurality of phases can be represented by two-dimensional components in the plane. Since a magnitude of a magnetic field vector generated by the current is inversely proportional to a distance from the center of the current, it is possible to detect current information with a sufficient magnitude as a signal when the distance is closer.

In the present invention, a current sensor is arranged in a region sandwiched between the plurality of conductors, and thus, can be arranged such that the distance from each of the currents of the plurality of phases becomes close so that magnitudes of the magnetic field vectors generated, respectively, from the plurality of phases can be evaluated at the same level.

It is not essentially necessary to individually acquire the currents of the individual conductors in control of a power converter. For example, in control of a three-phase alternating current, it is not necessary to acquire three current values in total individually for the three phases, and it suffices to obtain two-phase alternating current components orthogonal to each other.

For example, in the case of direct current, it is not necessary to acquire two current values in total individually for a positive electrode current and a negative electrode current, and either one or an average value of the positive electrode current and the negative electrode current may be acquired.

It is possible to detect a resultant magnetic field vector of the magnetic field vectors generated by the currents of the plurality of phases and to use a value thereof for control depending on the geometrical arrangement.

For example, since it suffices to provide not three but two three-phase current sensors for the respective phases, it is possible to realize a small size and high density. For example, the current sensors are conventionally arranged apart from each other in order to avoid mutual interference of magnetic field vectors, but it is possible to obtain the small size and high density by positively arranging the current sensors close to each other.

Embodiments according to the present invention will be described with reference to the drawings.

(First Embodiment)

Figure 1:
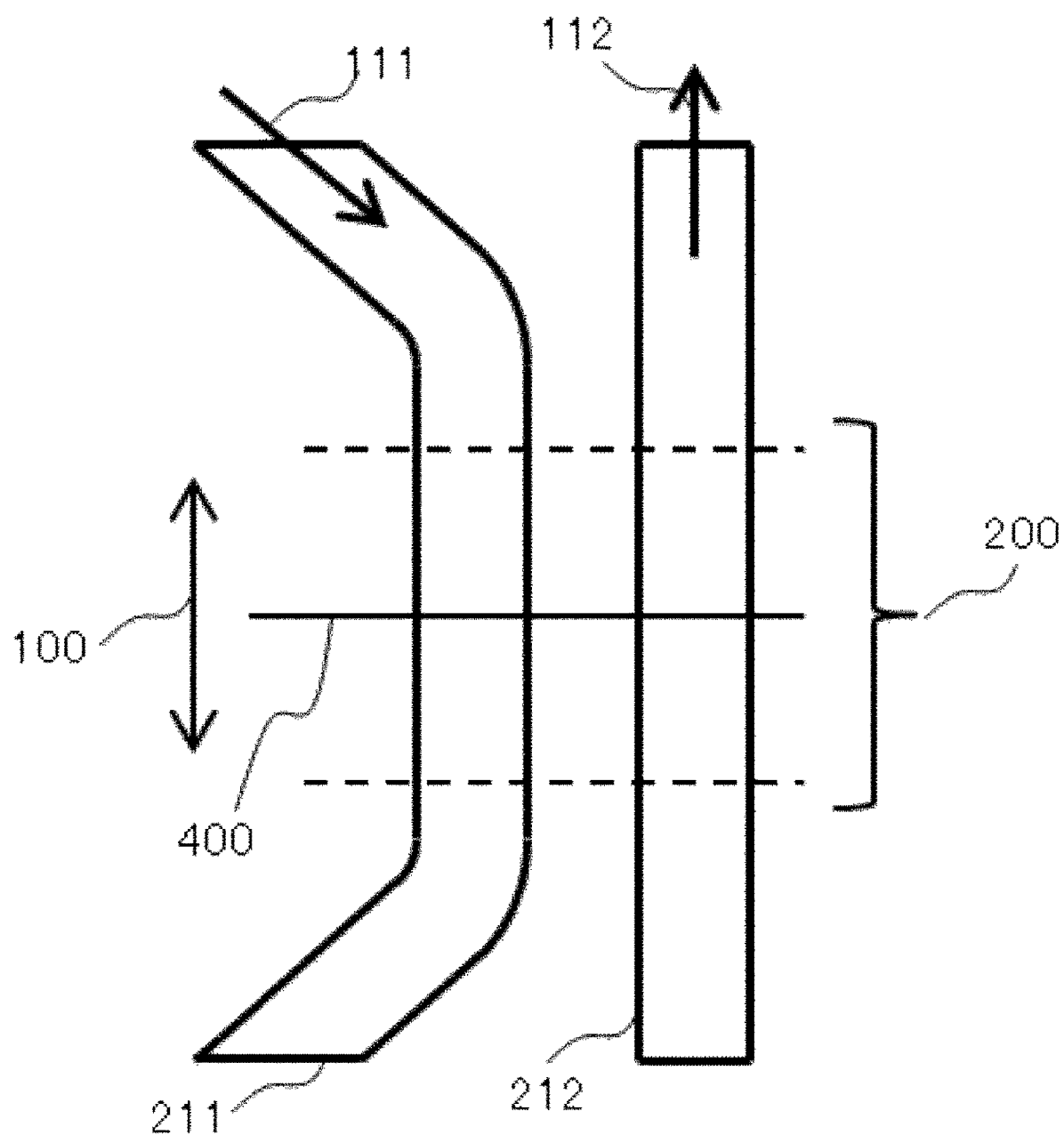
FIG. 1 is a top view of a positive-electrode-side conductor 211 and a negative-electrode-side conductor 212 according to the present embodiment.
Figure 2:
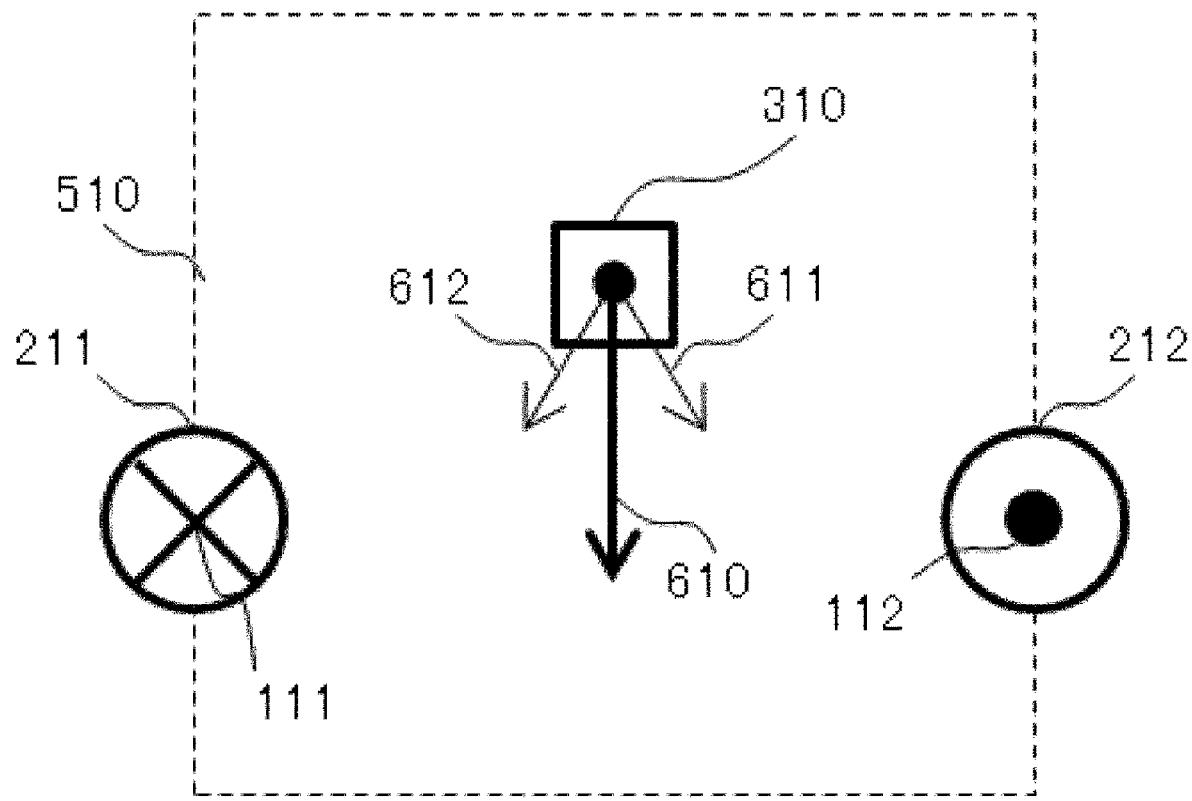
FIG. 2 is a cross-sectional view of a cross section 400 of FIG. 1 as viewed from a perpendicular direction.

FIG. 1 is a top view of a positive-electrode-side conductor 211 and a negative-electrode-side conductor 212 according to the present embodiment. FIG. 2 is a cross-sectional view of a plane 400 of FIG. 1 as viewed in a perpendicular direction.

A positive electrode current 111 flows in a positive-electrode-side conductor 211. A negative electrode current 112 flowing in an opposite direction from the positive electrode current 111 flows in a negative-electrode-side conductor 212. In the present embodiment, the positive-electrode-side conductor 211 forms two bent portions so as to provide a conductor portion 200 which is a part formed substantially parallel to the negative-electrode-side conductor 212. In this conductor portion 200, the currents flow in a direction 100 substantially parallel to each other.

As illustrated in FIG. 2, a region 510 is a region which is a locus obtained by moving a line segment, which connects a center portion of the conductor 211 and a center portion of the conductor 212 to an upper portion and a lower portion of the paper surface. This region 510 is defined to be within a region sandwiched between the conductor 211 and the conductor 212. Here, the conductor 211 and the conductor 212 are illustrated to be circular in a cross section in the present embodiment, but may have any shape. A current sensor 310 is arranged within the region 510.

A magnetic field vector 611 indicates a direction of a magnetic field generated by the positive electrode current 111. A magnetic field vector 612 indicates a direction of a magnetic field generated by the negative electrode current 112. The magnetic field resultant vector 610 is a vector obtained by combining the magnetic field vector 611 and the magnetic field vector 612 and is a resultant of magnetic field vectors generated by the positive electrode current 111 and the negative electrode current 112.

In the present embodiment, the current sensor 310 detects the magnetic field resultant vector 610 and outputs a value thereof. A power conversion apparatus or the like can use such an output value for control.

(Second Embodiment)

Figure 3:
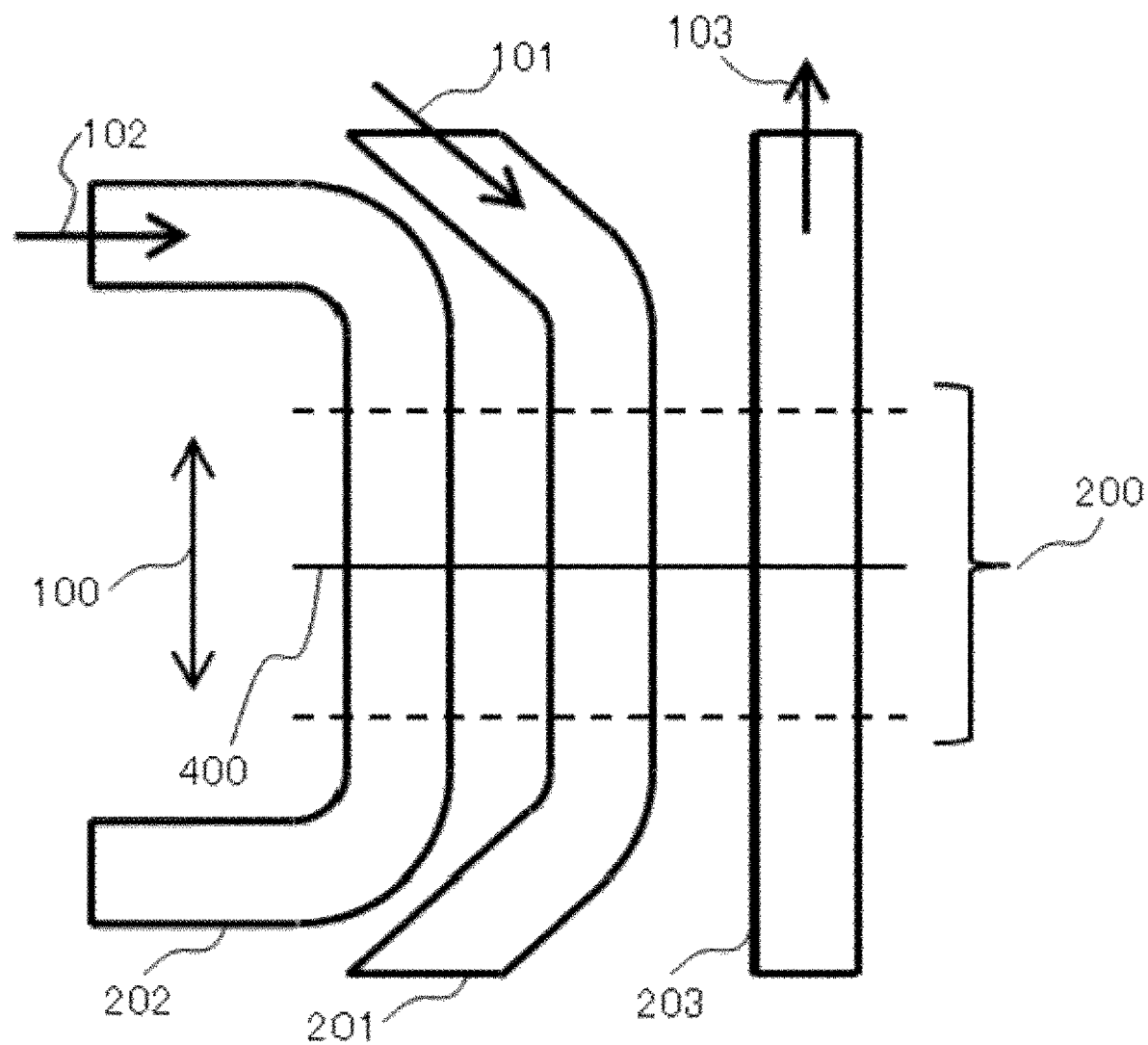
FIG. 3 is a top view of a U-phase conductor 201, a V-phase conductor 202, and a W-phase conductor 203 according to the present embodiment.
Figure 4:
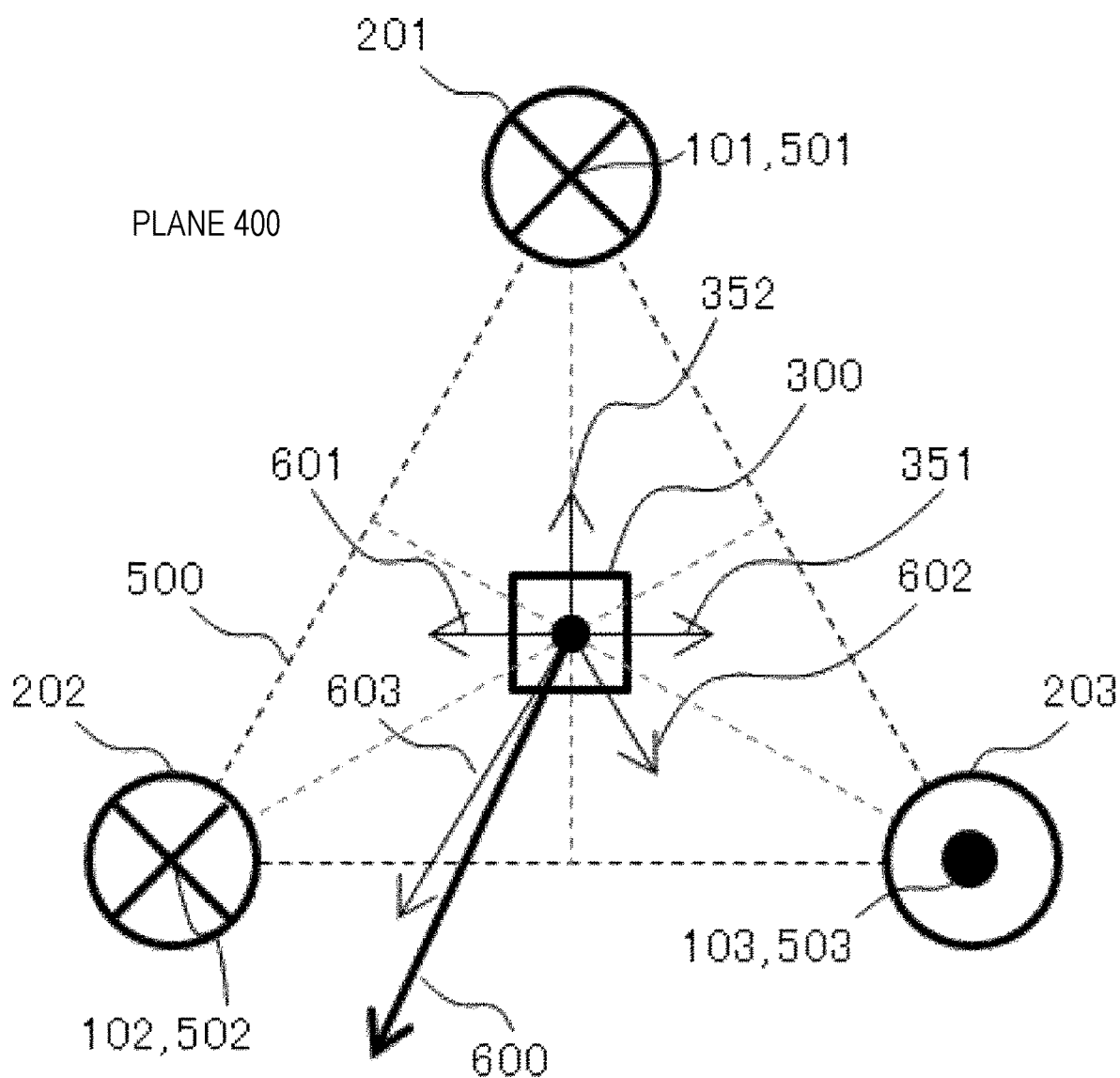
FIG. 4 is a cross-sectional view of a cross section 400 of FIG. 3 as viewed from a perpendicular direction.

FIG. 3 is a top view of a U-phase conductor 201, a V-phase conductor 202, and a W-phase conductor 203 according to the present embodiment. FIG. 4 is a cross-sectional view of a cross section 400 of FIG. 3 as viewed from a perpendicular direction.

A U-phase current 101 flows in the U-phase conductor 201. A V-phase current 102 flows in the V-phase conductor 202. A W-phase current 103 flowing in an opposite direction from the U-phase current 101 and the V-phase current 102 flows in the W-phase conductor 203. In the present embodiment, each of the U-phase conductor 201 and the V-phase conductor 202 forms two bent portions so as to provide a conductor portion 200 which is a part formed substantially parallel to the W-phase conductor 203. In this conductor portion 200, the currents flow in a direction 100 substantially parallel to each other.

A region 500 illustrated in FIG. 4 is a region connecting a center 501 of the U-phase conductor, a center 502 of the V-phase conductor, and a center 503 of the W-phase conductor. In the present embodiment, the region 500 is a triangle connecting three vertexes, but may be a polygon such as a rectangle using four or more conductors. A current sensor 300 is arranged within the region 500.

A magnetic field vector 601 indicates a direction of a magnetic field generated by the U-phase current 101. A magnetic field vector 602 indicates a direction of a magnetic field generated by the V-phase current 102. A magnetic field vector 603 indicates a direction of a magnetic field generated by the W-phase current 103. A magnetic field resultant vector 600 is a vector obtained by combining the magnetic field vector 601, the magnetic field vector 602, and the magnetic field vector 603.

In the present embodiment, the current sensor 300 detects the magnetic field resultant vector 600 and outputs a value thereof. A power conversion apparatus or the like can use such an output value for control.

Figure 9:
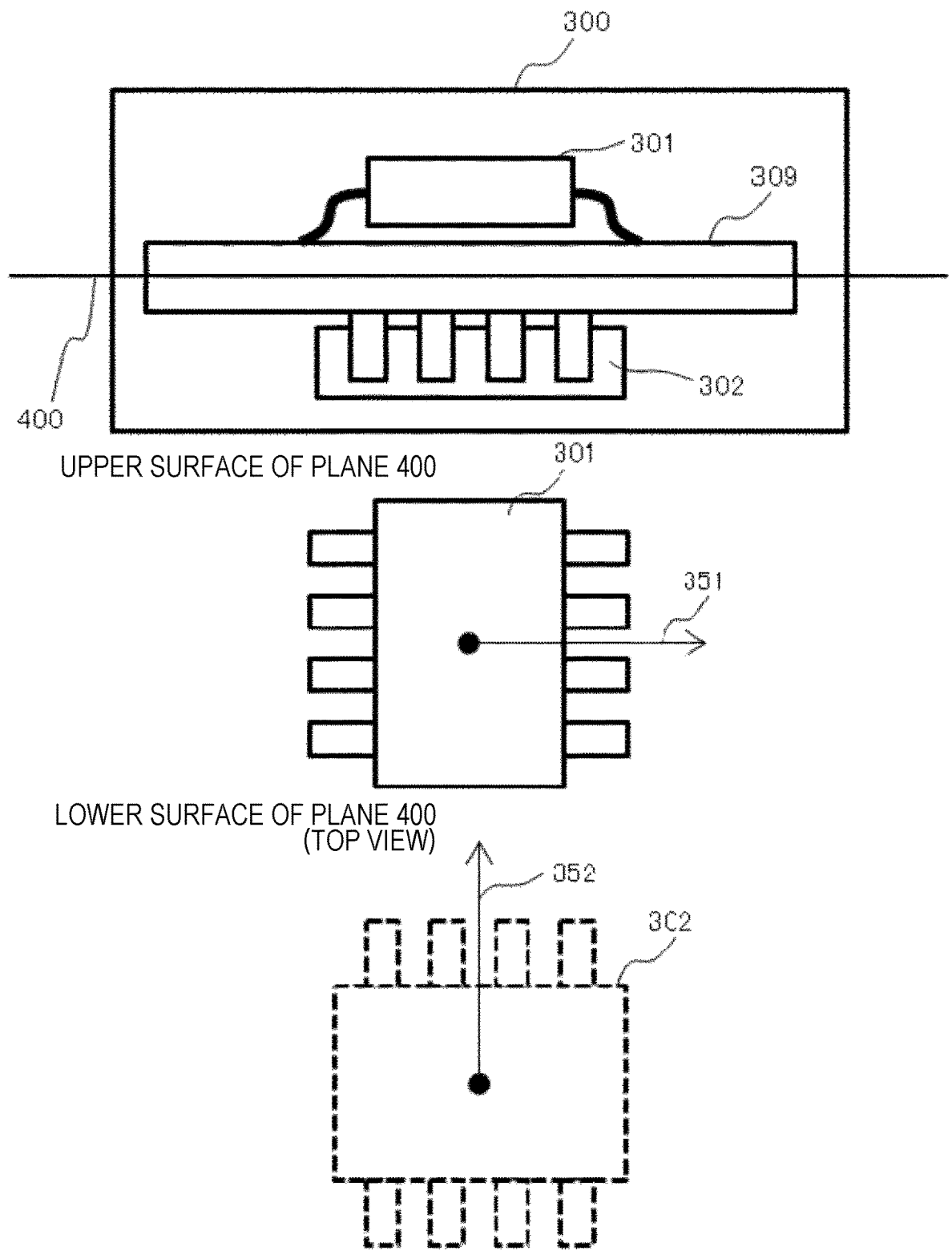
FIG. 9 is a side view, a top view, and a perspective view illustrating a relationship between a first current sensor unit 351 and a second current sensor unit 352 in the current sensor 300.

FIG. 9 is a side view, a top view, and a perspective view illustrating a relationship between a first current sensor unit 301 and a second current sensor unit 302 in the current sensor 300.

The current sensor 300 includes the first current sensor unit 301 that detects a magnetic field vector 351 illustrated in FIG. 4, and the second current sensor unit 302 that detects the magnetic field vector 352 in a direction different by 90 degrees from a magnetic field vector 351 detected by the first current sensor unit 301. That is, the second current sensor unit 302 is a sensor unit having the same configuration and function as the first current sensor unit 301, and is arranged to be rotated by 90 degrees from a center position of the first current sensor unit 301. Furthermore, the first current sensor unit 301 is arranged on one side of a substrate 309, and the second current sensor unit 302 is arranged on the other side of the substrate 309.

A representative example of a current sensor that measures a magnetic field vector is a linear Hall sensor. The linear Hall sensor can detect the intensity of magnetic flux density in one-axis positive/negative direction. When detecting a magnetic field vector in a plane, two axes are required so that two linear Hall sensors are required. The two linear Hall sensors can efficiently detect the magnetic field vector if having detection directions mutually shifted by 90 degrees in the same plane.

Figure 5:
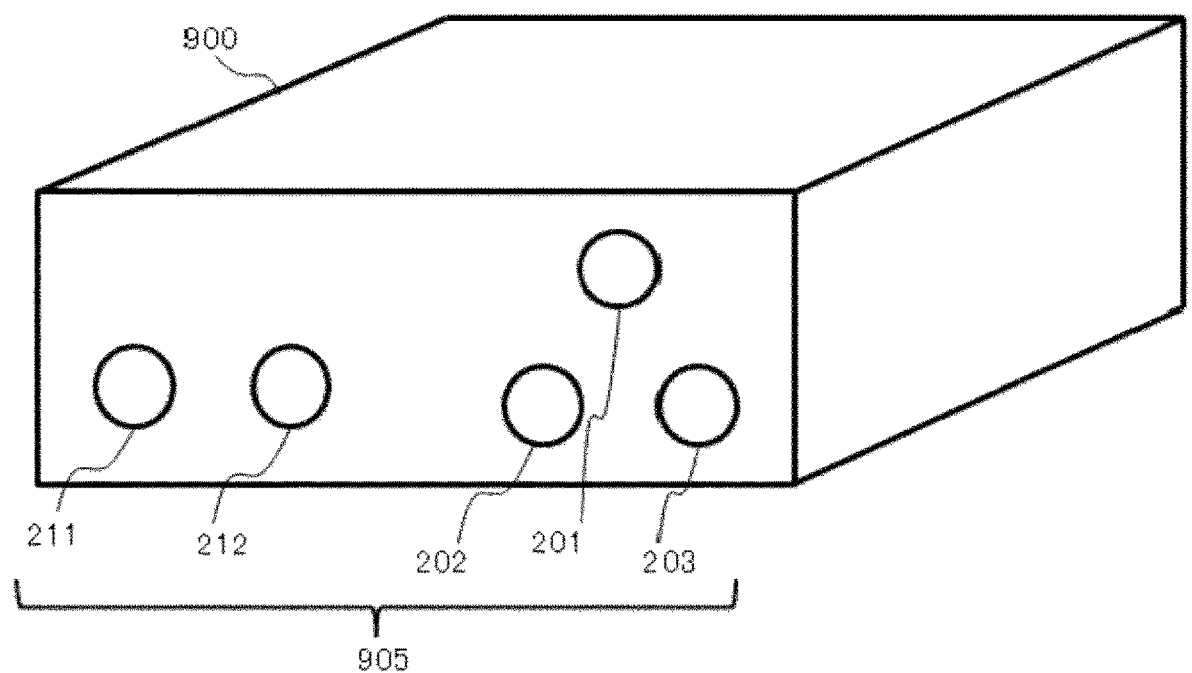
FIG. 5 is an external perspective view of a power converter 900.

FIG. 5 is an external perspective view of a power converter 900. The positive-electrode-side conductor 211, the negative-electrode-side conductor 212, the U-phase conductor 201, the V-phase conductor 202 and the W-phase conductor 203 illustrated in FIG. 1 are arranged on one side surface of the power conversion apparatus 900.

Figure 6:
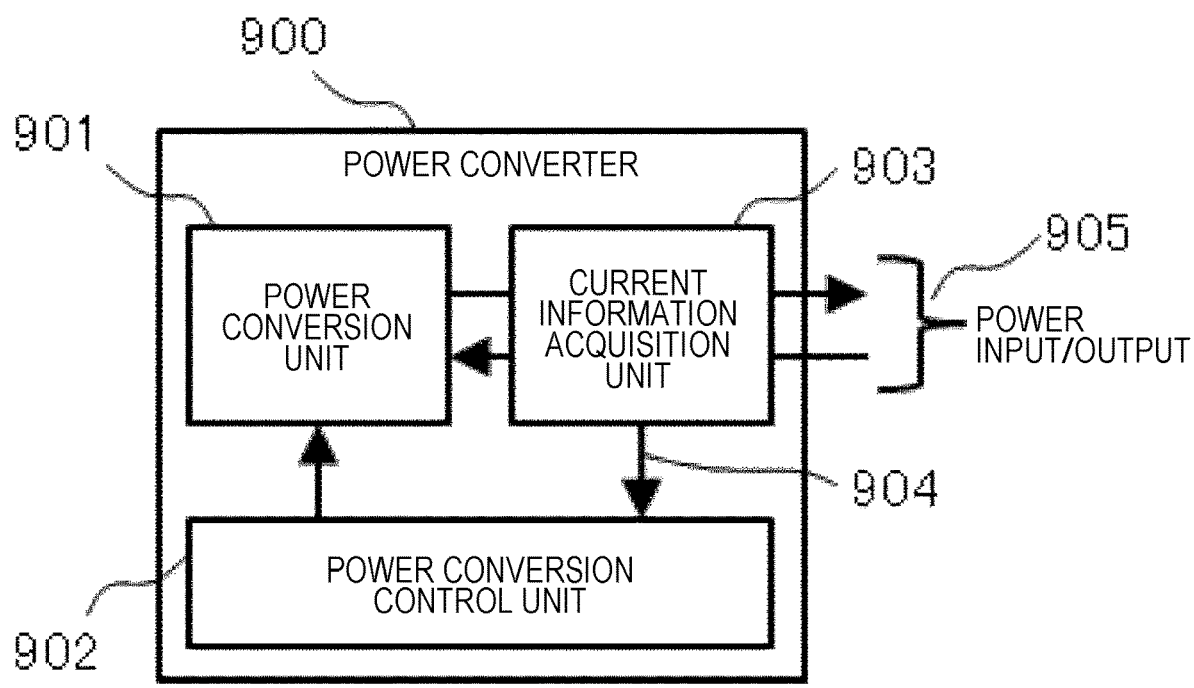
FIG. 6 is a functional block diagram of a power converter 900.

FIG. 6 is a functional block diagram of the power converter 900. A power input/output 905 corresponds to the positive-electrode-side conductor 211, the negative-electrode-side conductor 212, the U-phase conductor 201, the V-phase conductor 202, and the W-phase conductor 203 illustrated in FIG. 5. A power conversion unit 901 is constituted by a plurality of semiconductor elements, and has a function of converting direct current and alternating current to each other and stepping up or down a direct current voltage.

A power conversion control unit 902 outputs a control signal for controlling switching operations of the plurality of semiconductor elements based on an output signal of a current information acquisition unit 903. The current information acquisition unit 903 receives output values from the current sensors 300 and 310 illustrated in FIG. 2 and FIG. 4, and outputs current information 904.

(Third Embodiment)

Figure 7:
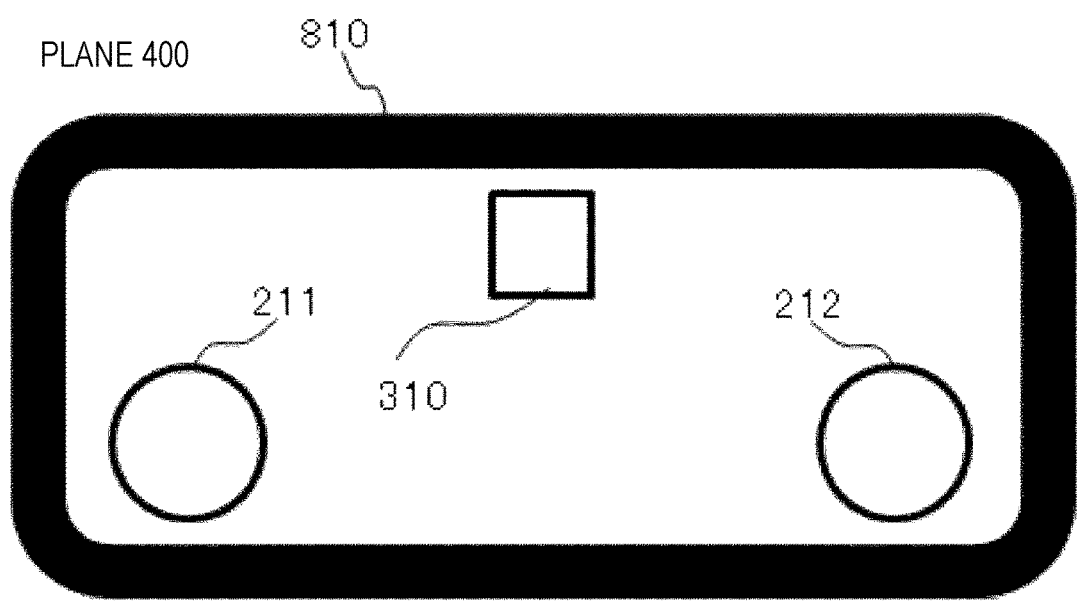
FIG. 7 is a cross-sectional view of a plane 400 as viewed from a perpendicular direction, which relates to a core 810 surrounding the positive-electrode-side conductor 211, the negative-electrode-side conductor 212, and a current sensor 310 according to the present embodiment.
Figure 8:
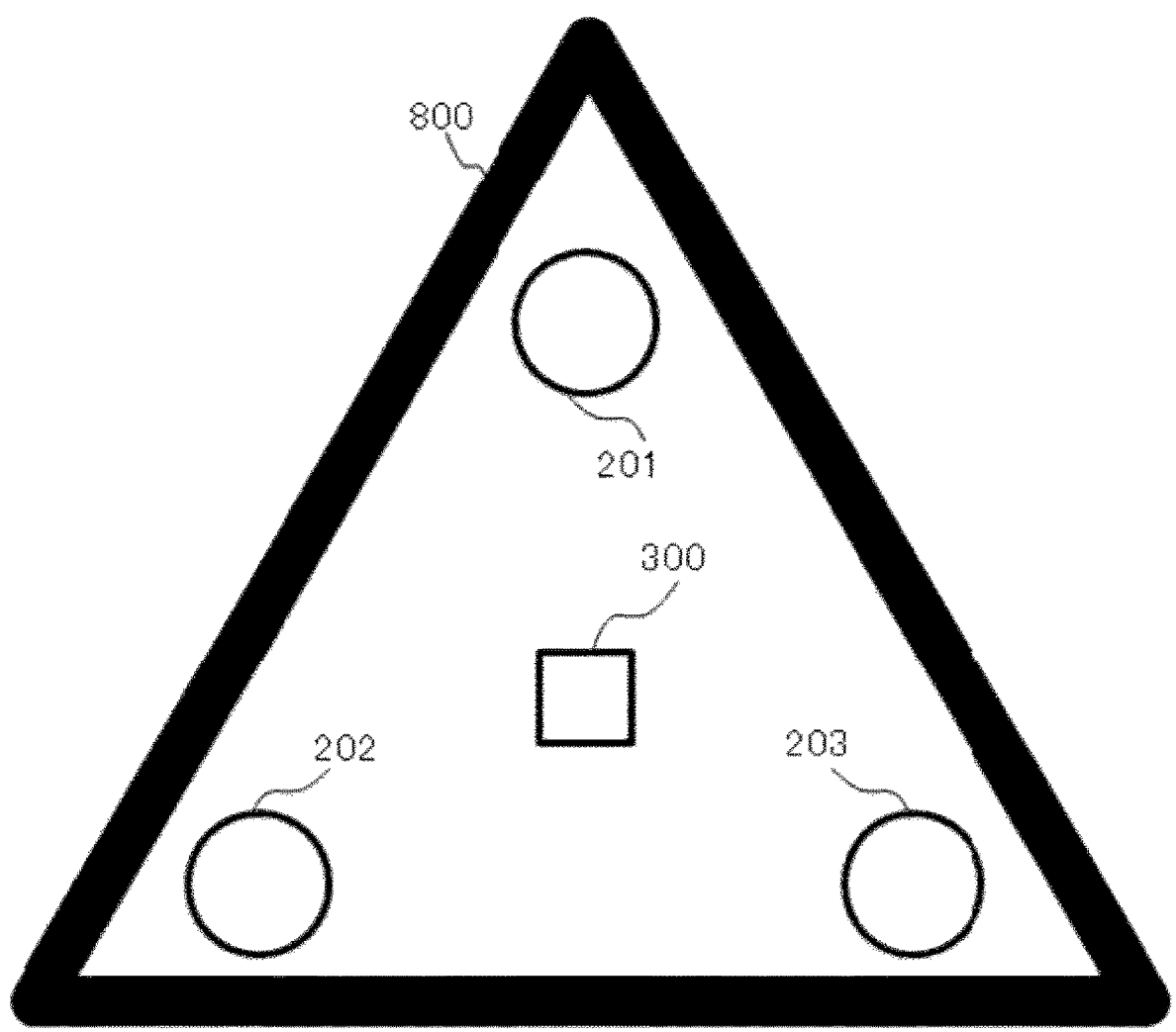
FIG. 8 is a cross-sectional view of the plane 400 as viewed from the perpendicular direction, which relates to a core 800 surrounding the U-phase conductor 201, the V-phase conductor 202, the W-phase conductor 203, and the current sensor 010 according to the present embodiment.

FIG. 7 is a cross-sectional view of a plane 400 as viewed from a perpendicular direction, which relates to a core 810 surrounding the positive-electrode-side conductor 211, the negative-electrode-side conductor 212, and a current sensor 310 according to the present embodiment. FIG. 8 is a cross-sectional view of the plane 400 as viewed from the perpendicular direction, which relates to a core 800 surrounding the U-phase conductor 201, the V-phase conductor 202, the W-phase conductor 203, and the current sensor 010 according to the present embodiment.

The current sensor according to the present embodiment is a system that measures a magnetic field vector. The current sensor desirably detects only the magnetic field vector generated by a current to be measured and prevents inflow of magnetic field vectors other than an object to be measured as much as possible.

Therefore, the core 810 of FIG. 7 collectively surrounds the positive-electrode-side conductor 211, the negative-electrode-side conductor 212, and the current sensor 310. On the other hand, the core 800 of FIG. 8 collectively surrounds the U-phase conductor 201, the V-phase conductor 202, the W-phase conductor 203, and the current sensor 300.

As the plurality of conductors to be measured and the current sensor are surrounded by the core, the externally generated magnetic field vector does not enter the core. In addition, there are three-phase common mode noise, common mode noise of a positive electrode and a negative electrode of direct current, and the like in the power converter. The core collectively surrounding the three phases or collectively surrounding the positive and negative electrodes of direct current has an effect of eliminating the above-described in-phase noise.

REFERENCE SIGNS LIST

101 U-phase current
102 V-phase current
103 W-phase current
111 positive electrode current
112 negative electrode current
201 U-phase conductor
202 V-phase conductor
203 W-phase conductor
200 conductor portion
211 positive-electrode-side conductor
212 negative-electrode-side conductor
300 current sensor
301 first current sensor unit
302 second current sensor unit
309 substrate
310 current sensor
351 magnetic field vector
352 magnetic field vector
400 plane
500 region
501 center of U-phase conductor
502 center of V-phase conductor
503 center of W-phase conductor
510 region
601 magnetic field vector
602 magnetic field vector
603 magnetic field vector
610 magnetic field resultant vector
611 magnetic field vector
612 magnetic field vector
800 core
810 core
900 power converter
901 power conversion unit
902 power conversion control unit
903 current information acquisition unit
904 current information

The invention claimed is:

1. A current detection device comprising:
a plurality of conductors corresponding to currents of a plurality of phases; and
a current sensor having a first sensor unit and a second sensor unit,
wherein the plurality of conductors is formed so as to have a conductor portion in which the currents flowing in the plurality of conductors, respectively, are substantially parallel,
in a cross section in a direction perpendicular to a flow direction of the current of the conductor portion, the current sensor is arranged in a region sandwiched between the plurality of conductor portions, and
the first sensor unit and the second sensor unit have a positional relationship to detect magnetic field vectors in directions different by 90 degrees from each other.

2. The current detection device according to claim 1, wherein the plurality of conductors is constituted by three or more conductors corresponding to currents of three or more phases, and
the current sensor is arranged in a region having each of the three or more conductors as a vertex and outputs information on a current flowing in the conductors based on a resultant magnetic field vector of the three or more conductors.

3. The current detection device according to claim 1, comprising
a core that collectively surrounds the plurality of conductors.

4. A power conversion apparatus comprising the current detection device according to claim 1, wherein the power conversion apparatus performs power conversion control based on the current information.

5. A current detection device comprising:

a plurality of conductors corresponding to currents of a plurality of phases; and a current sensor, wherein the plurality of conductors is formed so as to have a conductor portion in which the currents flowing in the plurality of conductors, respectively, are substantially parallel, and in a cross section in a direction perpendicular to a flow direction of the current of the conductor portion, the current sensor is arranged in a region sandwiched between the plurality of conductor portions, and outputs information on a current flowing in the conductors based on a resultant of magnetic field vectors generated by the plurality of currents, wherein the plurality of conductors comprise three or more conductors corresponding to currents of three or more phases, and the current sensor is arranged in a region having each of the three or more conductors as a vertex and outputs information on a current flowing in the conductors based on a resultant magnetic field vector of the three or more conductors.

6. The current detection device according to claim 1, comprising a core that collectively surrounds the plurality of conductors.

7. A power conversion apparatus comprising the current detection device according to claim 5, wherein the power conversion apparatus performs power conversion control based on the current information.

* * * * *